United States Patent [19]

Katoh et al.

[11] Patent Number: 5,418,329
[45] Date of Patent: May 23, 1995

[54] HIGH FREQUENCY IC PACKAGE

[75] Inventors: Takayuki Katoh; Yoshihiro Notani, both of Itami, Japan

[73] Assignee: Mitsubishi Denki Kabushiki Kaisha, Tokyo, Japan

[21] Appl. No.: 75,321

[22] Filed: Jun. 11, 1993

[30] Foreign Application Priority Data

Dec. 11, 1992 [JP] Japan .................. 4-353082

[51] Int. Cl.⁶ ............................. H05K 5/06
[52] U.S. Cl. .................. 174/52.3; 174/260; 174/261; 257/691; 361/736
[58] Field of Search ............... 361/728, 736, 752, 818, 361/816–817; 174/52.2, 52.4, 35 R, 35 MS, 260–266, 52.3; 257/678, 690, 691, 692, 693, 659, 660

[56] References Cited

U.S. PATENT DOCUMENTS

| | | | |
|---|---|---|---|
| 3,721,746 | 3/1973 | Knappenberger | 174/35 MS |
| 4,370,515 | 1/1983 | Donaldson | 361/818 |
| 4,658,334 | 4/1987 | McSparran et al. | 361/818 |

FOREIGN PATENT DOCUMENTS

| | | |
|---|---|---|
| 63-142897 | 6/1988 | Japan . |
| 63-115228 | 7/1988 | Japan . |
| 63-200545 | 8/1988 | Japan . |
| 2016095 | 9/1992 | WIPO .................. 361/818 |

*Primary Examiner*—Bot Ledynh
*Attorney, Agent, or Firm*—Leydig, Voit & Mayer

[57] ABSTRACT

A high frequency IC package includes a dielectric package body having a surface, a high frequency signal transmission line and a power supply line disposed on the surface of the package body, a high frequency IC chip disposed on the surface of the package body and electrically connected to the high frequency signal transmission line and the power supply line by wires, and a lid hermetically sealing and shielding the IC chip. The lid includes a plane part parallel to the surface of the IC chip and side walls, perpendicular to the plane part, surrounding the IC chip. Since the side wall is not present on the surface of the package body but included in the lid, during the wire-bonding process of the IC chip, unfavorable contact between the cavity wall and bonding tool is avoided, reducing the lengths of bonding wires and signal transmission lines. As the result, reflection loss, conductor loss, and cavity resonance are reduced.

5 Claims, 18 Drawing Sheets

HIGH FREQUENCY IC PACKAGE

FIELD OF THE INVENTION

The present invention relates to a package for mounting high frequency IC chips operating in the millimeter-wave frequency band above 30 GHz.

BACKGROUND OF THE INVENTION

FIGS. 16(a) and 16(b) are a plan view and a sectional view illustrating a conventional dielectric package for mounting high frequency IC chips. In the figures, reference numeral 1 designates a package body comprising a dielectric material, such as alumina or glass. The size of the package body 1 is 17 mm×10 mm. Reference numeral 2 designates a space for mounting IC chips (hereinafter referred to as a cavity) having a depth equivalent to the thickness of the IC chip to be mounted. The cavity 2 is electrically connected to a grounding layer 11 on the rear surface of the package body 1 via through-holes 3. The grounding layer 11 is formed by Au plating or the like. A cavity wall 7 surrounds the cavity 2. High frequency signal transmission lines 4, i.e., microstrip lines, are disposed on the package body 1 extending from opposite ends of the package body 1 under the cavity wall 7 until they reach the cavity 2. Reference numeral 12 designates DC bias lines.

FIGS. 17(a) and 17(b) are a plan view and a sectional view illustrating a dielectric package on which high frequency IC chips are mounted. In the figures, two high frequency IC chips 8 are mounted on the cavity 2 of the dielectric package body 1 using solder or conductive adhesive. Then, as shown in FIG. 18, electrodes (not shown) of the IC chips 8 are connected to each other and to the high frequency transmission lines 4 and the DC bias lines 12 on the package body 1 by wires or ribbons using a wedge-shaped blade 10 and, thereafter, a lid 6 comprising the same material as the package body 1 is put on the cavity wall 7 to hermetically shield the IC chips 8.

In the conventional high frequency IC package, the cavity 2 is formed in the package body 1 and the IC chips 8 are disposed on the surface of the cavity 2, whereby the wires for connecting the transmission lines 4 on the package body and the IC chips 8 are shortened. Generally, in a high frequency band, particularly in the millimeter frequency band above 30 GHz, the reflection loss due to impedance mismatching and conductor loss due to the length of the transmission line are significant. Therefore, it is necessary to dispose the cavity wall 7' close to the cavity 2 as shown in FIG. 19 to shorten the wires 13 and the transmission lines 4. When the IC chips are bonded to the cavity 2 of the conventional package, as shown in FIG. 18, the bonding process is carried out in the vicinity of the cavity wall using a manual bonding tool while irradiating the cavity 2 with light in the direction indicated by the arrow 9 and observing with operator's eyes. If the cavity wall 7' is close to the cavity 2, the wedge-shaped blade 10 at the tip of the wire bonder unfavorably contacts the cavity wall 7'. In order to avoid this contact, the cavity wall 7 must be spaced from the edge of the cavity by more than 7 mm and, therefore, it is difficult to reduce the lengths of the wires and the transmission lines inside the cavity wall.

In addition, such a large space inside the cavity wall increases the radiation loss. Further, since the interval between the chip and the cavity wall in the direction perpendicular to the high frequency signal input-output direction cannot be reduced, a cavity resonance occurs, which adversely affects the high frequency characteristics.

SUMMARY OF THE INVENTION

It is an object of the present invention to provide a high frequency IC package in which a cavity wall is disposed close to a chip mounting part and the lengths of wires and transmission lines inside the cavity wall are significantly reduced, thereby reducing reflection loss, conductor loss, radiation loss, and cavity resonance.

It is another object of the present invention to provide a high frequency IC package including a plurality of IC chips in which the IC chips are effectively isolated from each other to reduce the radiation loss.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, a high frequency IC package includes a lid united with a cavity wall. Since the cavity wall is not present on the package body, the wire-bonding of IC chip is carried out on the flat surface of the package body, significantly reducing the lengths of wires or signal transmission lines.

According to a second aspect of the present invention, when a plurality of IC chips are mounted on the package, a grounded partition is disposed between adjacent IC chips. Therefore, the isolation between adjacent IC chips is improved.

DETAILED DESCRIPTION OF THE PREFERRED EMBODIMENTS

Figure 1:
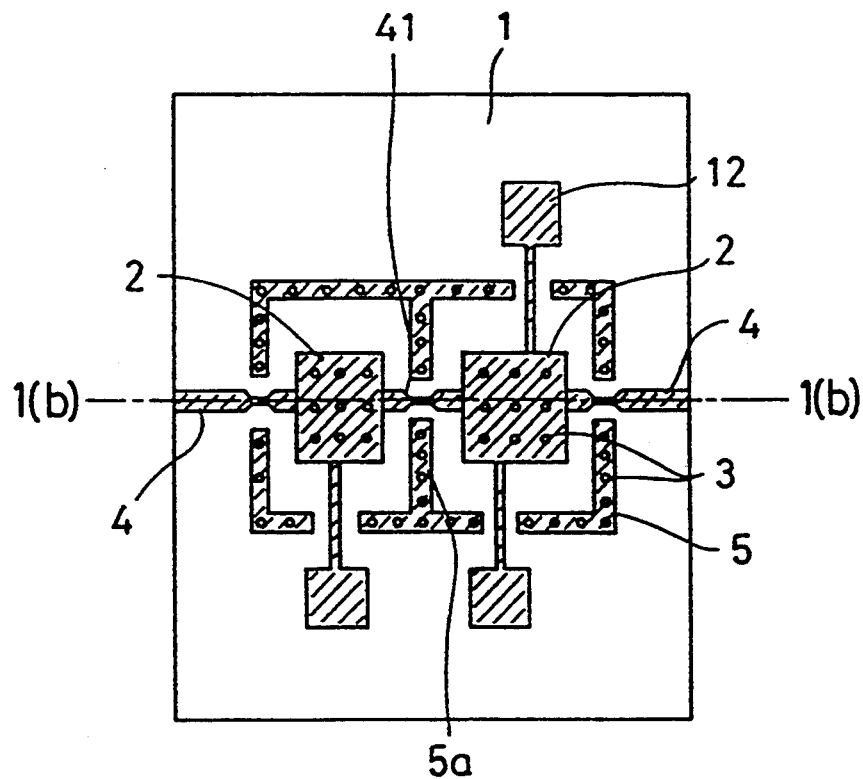
FIGS. 1(a) and 1(b) are a plan view and a sectional view illustrating a package body in accordance with a first embodiment of the present invention.
Figure 1:
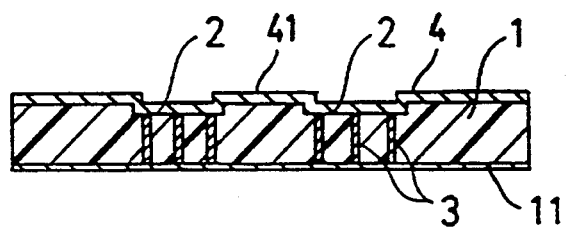

FIG. 1(a) is a plan view illustrating a package body of a high frequency IC package in accordance with a first embodiment of the present invention, and FIG. 1(b) is a sectional view taken along line 1b—1b of FIG. 1(a). In FIG. 1(a), the package body 1 does not have a cavity wall but has a patterned grounding conductor 5 surrounding chip mounting parts (hereinafter referred to as cavities) 2. The grounding conductor pattern 5 is electrically connected to the grounding layer 11 on the rear surface of the package body 1 via through-holes 3. Reference numeral 41 designates a high frequency signal transmission line disposed between the cavities 2.

Figure 3:
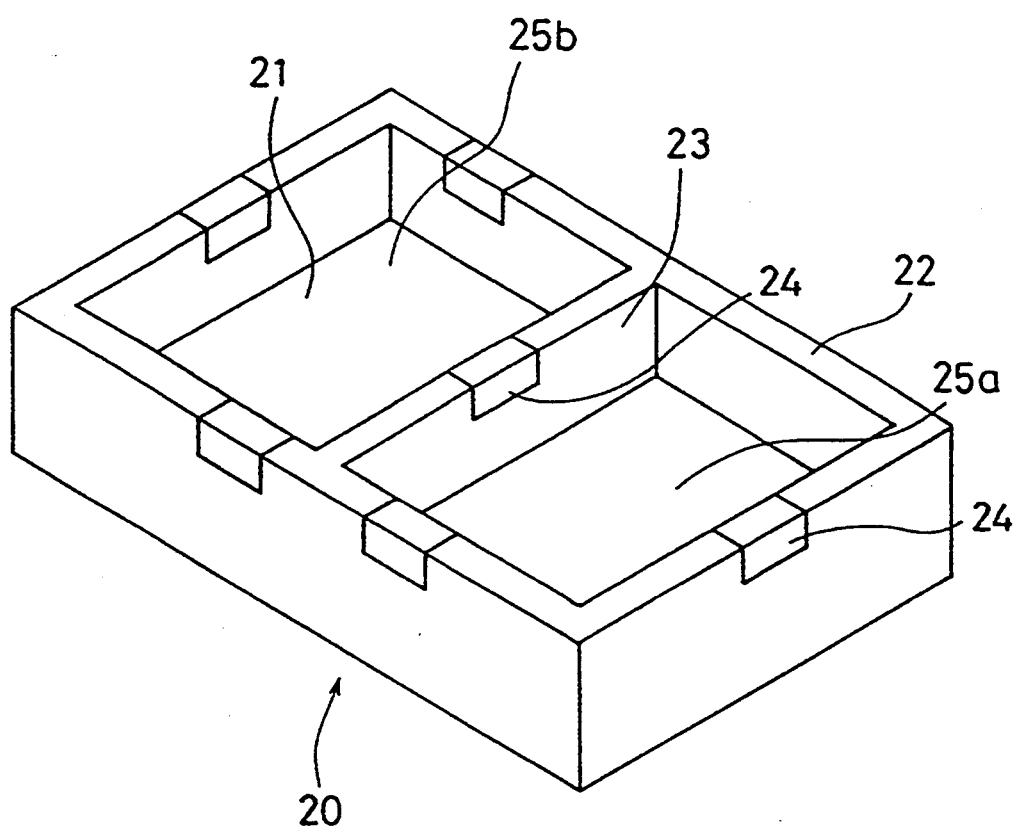
FIG. 3 is a perspective view illustrating a lid for the package body of FIGS. 1(a) and 1(b)

FIG. 3 is a perspective view illustrating a lid 20 for the package body of FIGS. 1(a) and 1(b). The lid 20 includes a ceiling part 21 and a side wall (hereinafter referred to as cavity wall) 22. The space inside the cavity wall 22 is divided into two by a partition 23, providing two chip housing chambers 25a and 25b. The cavity wall 22 and the partition 23 have dielectric portions 24.

The lid 20 comprises a metal, a dielectric material, such as a plastic or a ceramic. When the lid 20 comprises a metal, a ceramic or the like is buried in portions of the lid 20 to form the dielectric parts 24. When the lid 20 comprises a plastic or a ceramic, the surface of the lid is selectively plated with a metal leaving portions 24 exposed.

A description is given of the method for assembling the high frequency IC package.

Figure 2:
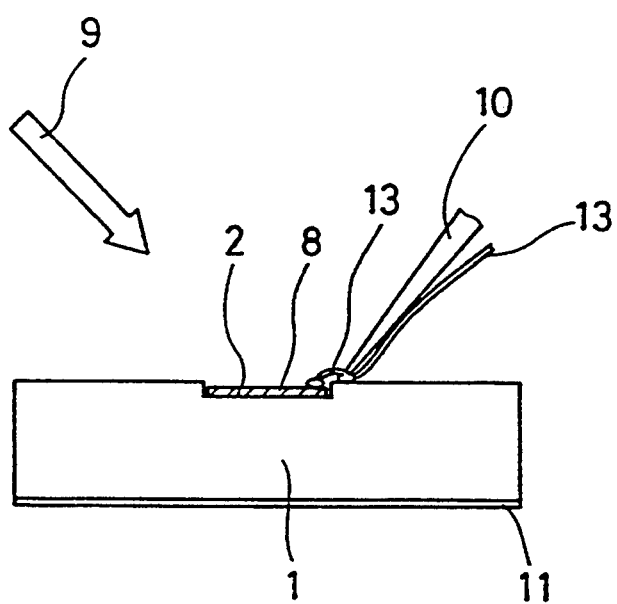
FIG. 2 is a schematic diagram for explaining a method for mounting an IC chip on the package body of FIGS. 1(a) and 1(b)

First of all, as shown in FIG. 2, a high frequency IC chip 8 is bonded to the cavity 2 of the package body 1, and an electrode (not shown) on the IC chip 8 is connected to the high frequency signal transmission line or the DC bias line on the package body 1 using wires or ribbons. The wire-bonding process is carried out in the vicinity of an end of the chip while irradiating the surface with light in the direction indicated by the arrow 9 and observing with operator's eyes. Even if the electrode of the IC chip 8 is connected to the signal transmission line or the DC bias line using short wires or ribbons 13, since no cavity wall is present on the package body, unfavorable contact between the blade 10 and the cavity wall is avoided.

Figure 4:
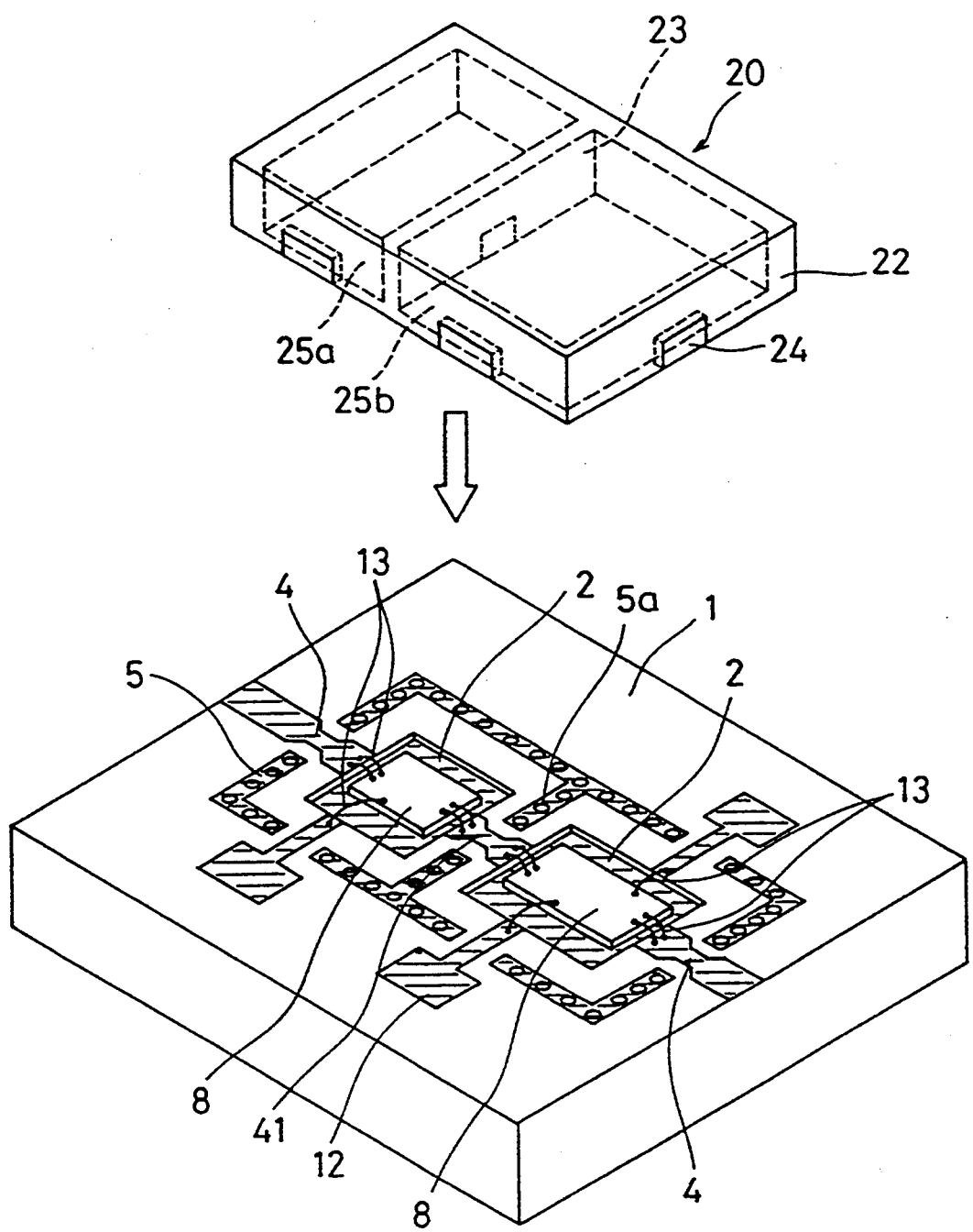
FIG. 4 is a perspective view illustrating the package body of FIGS. 1(a) and 1(b) on which IC chips are mounted and the lid of FIG. 3, before the IC chips are covered with the lid.

FIG. 4 is a perspective view illustrating the package body 1 on which two IC chips 8 are mounted and the lid 20 of FIG. 2 before the IC chips 8 are covered with the lid 20. In FIG. 4, electrodes (not shown) of the IC chips 8 are connected to the high frequency signal transmission lines 4 and 41 and the DC bias lines 12 using the wires or ribbons 13. When the lid 20 is put on the package body 1, the dielectric parts 24 of the cavity wall 22 of the lid 20 are applied to the signal transmission lines 4 and the DC bias lines 12 on the package body 1, and the dielectric part 24 of the partition 23 is applied to the signal transmission line 4 between the cavities 2. Portions of the cavity wall 22 and the partition 23 other than the dielectric parts 24 are respectively applied to the grounding conductor patterns 5 and 5a on the package body 1.

Figure 5:
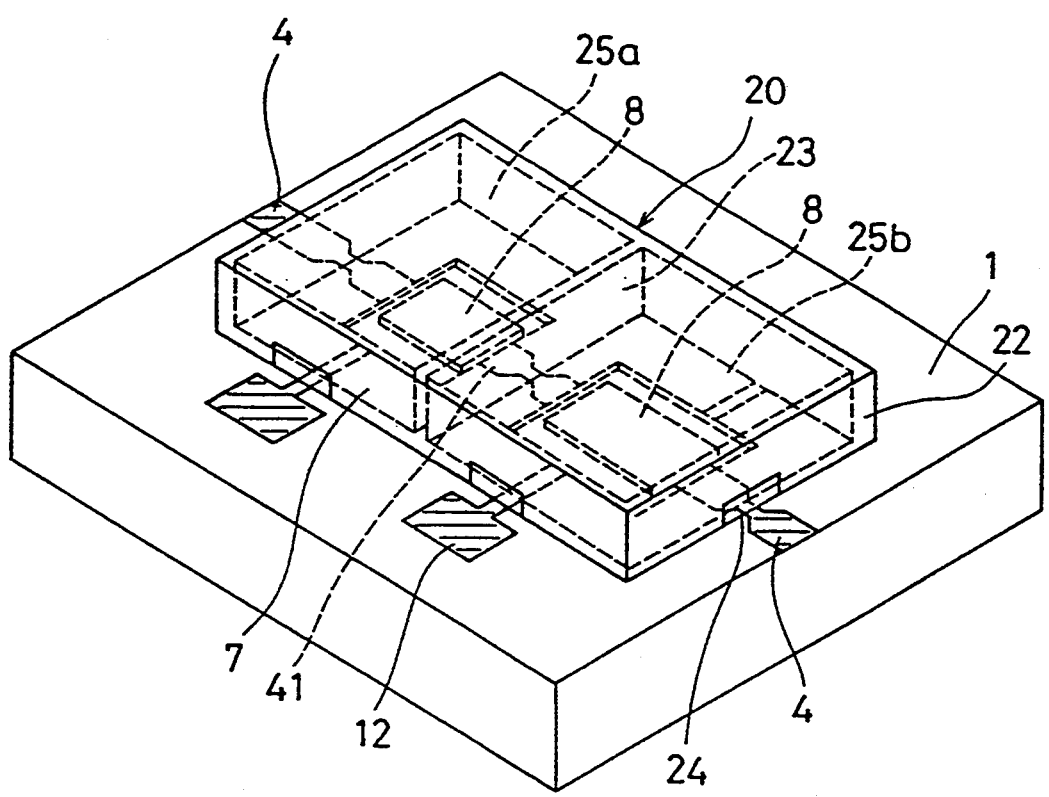
FIG. 5 is a perspective view illustrating a high frequency IC package in accordance with the first embodiment of the present invention, in which IC chips mounted on the package body of FIGS. 1(a) and 1(b) are hermetically shielded by the lid of FIG. 3.

FIG. 5 is a perspective view illustrating a high frequency IC package in which the IC chips 8 mounted on the package body 1 are covered with the lid 20. The two IC chips 8 are hermetically sealed and shielded in the chip housing chambers 25a and 25b of the lid 20, respectively. The space between the cavity wall 22 and the chip 8 is only 0.2 to 0.3 mm, which means that the space is significantly reduced compared with the conventional structure. The chip housing chambers 25a and 25b are filled with an inactive gas, such as nitrogen or helium.

According to the first embodiment of the present invention, the lid 20 having the cavity wall 22 encloses the IC chips on the package body 1 and hermetically seals and shields them. The unfavorable contact between the wedge-shaped blade and the cavity wall is avoided during the wire-bonding process. Therefore, the IC chips 8 are connected to the signal transmission lines 4 and 41 and the DC bias lines 12 using shorter wires or ribbons than those used in the conventional structure, reducing the reflection loss, the conductor loss, and the radiation loss. In addition, since the IC chip 8 and the cavity wall 22 are close to each other, cavity resonance is reduced, improving the high frequency characteristics.

In addition, since the lid 20 is in contact with the grounding conductor pattern 5 on the surface of the package body 1, the high frequency shielding effect is increased.

A description is given of a high frequency IC package in accordance with a second embodiment of the present invention. In this second embodiment, the partition for separating the two adjacent IC chips has two parts, and the high frequency signal transmission line on the package body connecting the two IC chips is partially disposed between the partitions.

Figure 6:
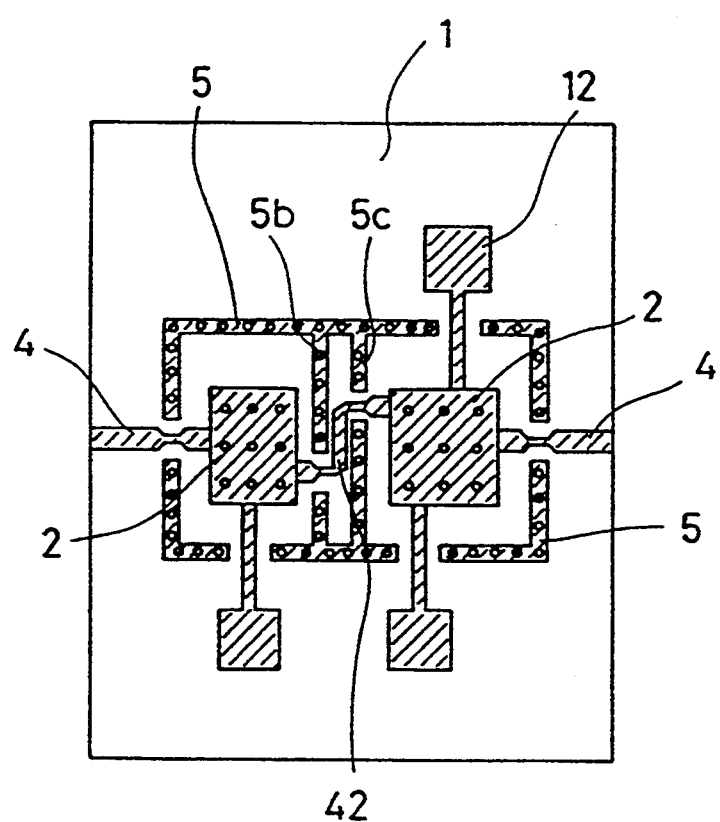
FIG. 6 is a plan view illustrating a package body in accordance with a second embodiment of the present invention.
Figure 7:
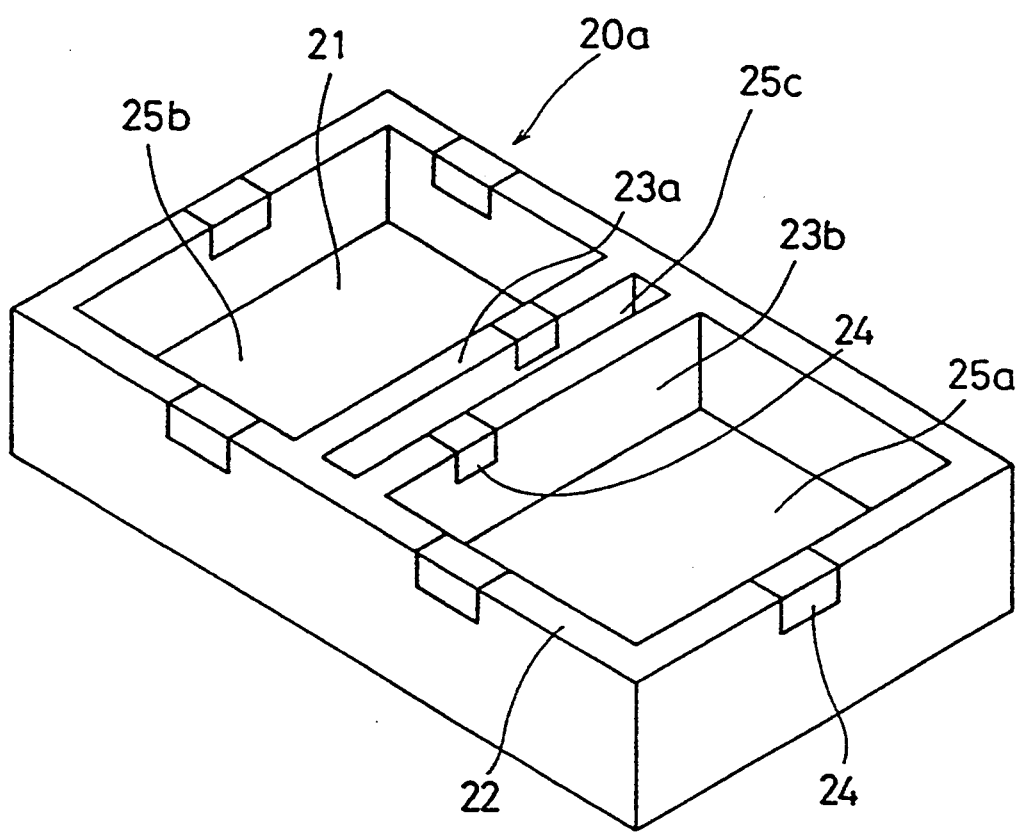
FIG. 7 is a perspective view illustrating a lid for the package body of FIG. 6.

FIG. 6 is a plan view illustrating the package body in accordance with the second embodiment of the present invention. In FIG. 6, opposite ends of the high frequency signal transmission line 42 connecting two adjacent cavities 2 are bent at right angles in a region between the grounding conductors 5b and 5c. FIG. 7 is a perspective view illustrating a lid for the package body of FIG. 6. The lid 20a has two partitions 23a and 23b which divide the space inside the cavity wall 22 into two chip housing chambers 25a and 25b. A space 25c is produced between the partitions 23a and 23b. The cavity wall 22 and the partitions 23a and 23b have dielectric portions 24.

Figure 8:
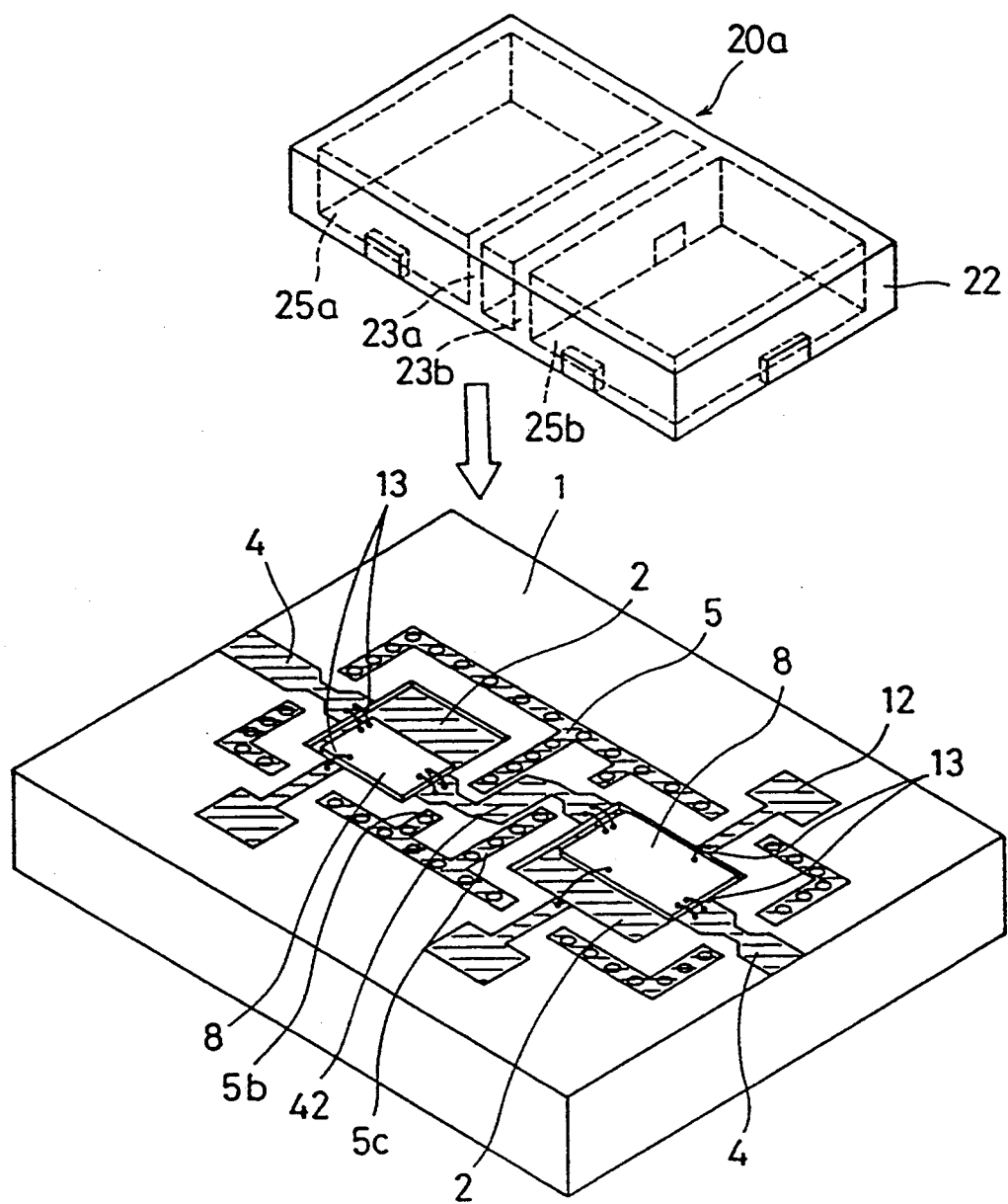
FIG. 8 is a perspective view illustrating the package body of FIG. 6 on which IC chips are mounted and the lid of FIG. 7, before the IC chips on the package body are covered with the lid.

FIG. 8 is a perspective view illustrating the package body 1 of FIG. 6 on which two IC chips 8 are mounted and the lid 20a of FIG. 7, before the IC chips 8 are covered with the lid 20a. In FIG. 8, electrodes (not shown) of the IC chips 8 are connected to the high frequency signal transmission lines 4 and 42 and the DC bias lines 12 using the wires or ribbons 13. When the lid 20a is put on the package body 1, the dielectric parts 24 of the cavity wall 22 of the lid 20a are applied to the signal transmission lines 4 and the DC bias lines 12, and the dielectric parts 24 of the partitions 23a and 23b are applied to the signal transmission line 42 which connects the IC chips 8 to each other. Portions of the cavity wall 22 other than the dielectric parts 24 are applied to the grounding conductor 5, and portions of the partitions 23a and 23b other than the dielectric parts 24 are applied to the grounding conductors 5b, and 5c, respectively.

According to the second embodiment of the present invention, since the grounded partitions 23a and 23b are present between the adjacent IC chips 8 and the signal transmission line 42 connecting the IC chips 8 to each other is disposed in the region between the partitions 23a and 23b, the isolation between the IC chips 8 is improved in addition to the effects of the first embodiment, whereby the radiation loss is further reduced.

A description is given of a high frequency IC package in accordance with a third embodiment of the present invention.

Figure 9:
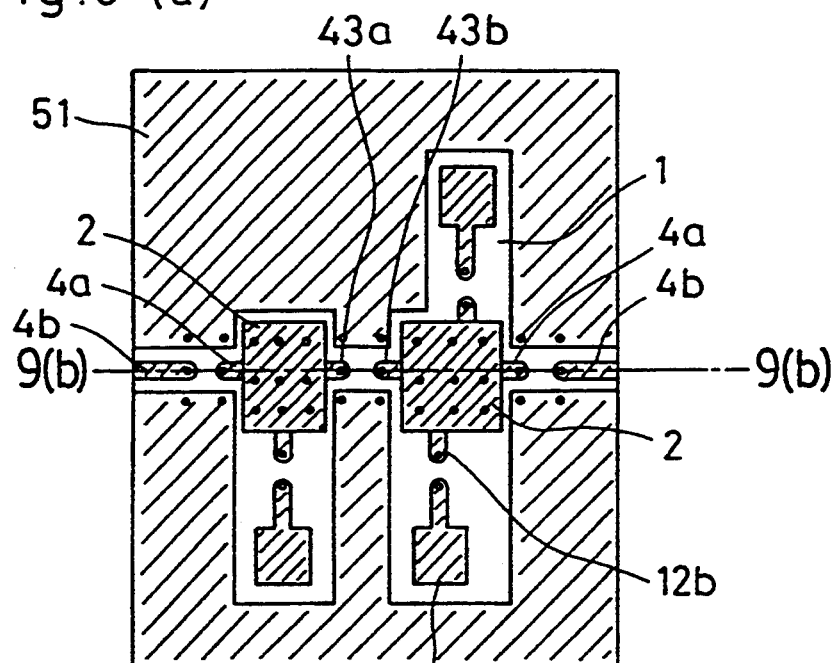
FIGS. 9(a)–9(c) are a plan view and sectional views illustrating a package body in accordance with a third embodiment of the present invention.
Figure 9:
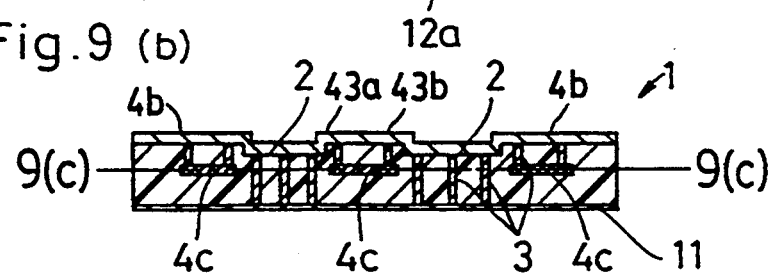
Figure 9:
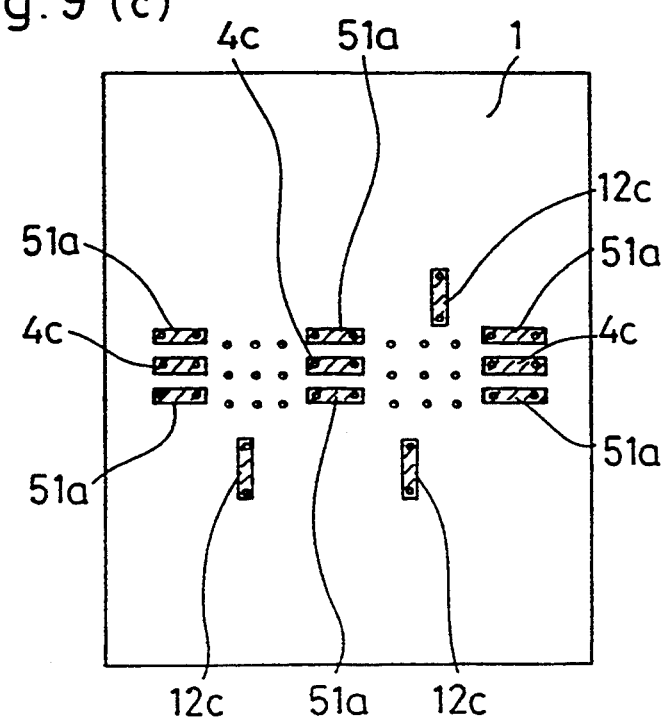

FIGS. 9(a)-9(c) are diagrams illustrating a package body of the high frequency IC package according to the third embodiment of the present invention, in which FIG. 9(a) is a plan view, FIG. 9(b) is a cross-section taken along line 9b—9b of FIG. 9(a), and FIG. 9(c) is a cross-section taken along line 9c—9c of FIG. 9(b). In this third embodiment, a large part of the surface of the package body 1 is covered with a grounding conductor pattern 51 which is connected to the grounding layer 11 on the rear surface of the package body 1 via throughholes 3. On the surface of the package body 1 where the grounding conductor pattern 51 is absent, the signal transmission line at each of the signal input and output ends is divided into two lines 4a and 4b, and the signal transmission line between the cavities 2 is divided into two lines 43a and 43b. These signal transmission lines 4a, 4b, 43a, and 43b are electrically connected by signal transmission lines 4c buried in the package body 1 and the through-holes 3. The DC bias line is also divided into two lines 12a and 12b on the surface of the package body 1 and the lines 12a and 12b are electrically connected to each other by the bias line 12c buried in the package body 1 and the through-holes 3. Grounding conductors 51a are disposed at opposite sides of the buried transmission line 4c to make a coplanar line. In producing this structure, for example, the package body 1 is divided into two parts along the line 9c—9c of FIG. 9(b), the transmission lines 4c, the grounding conductors 51a, and the bias lines 12c are formed, and the divided two parts are put together again.

Figure 10:
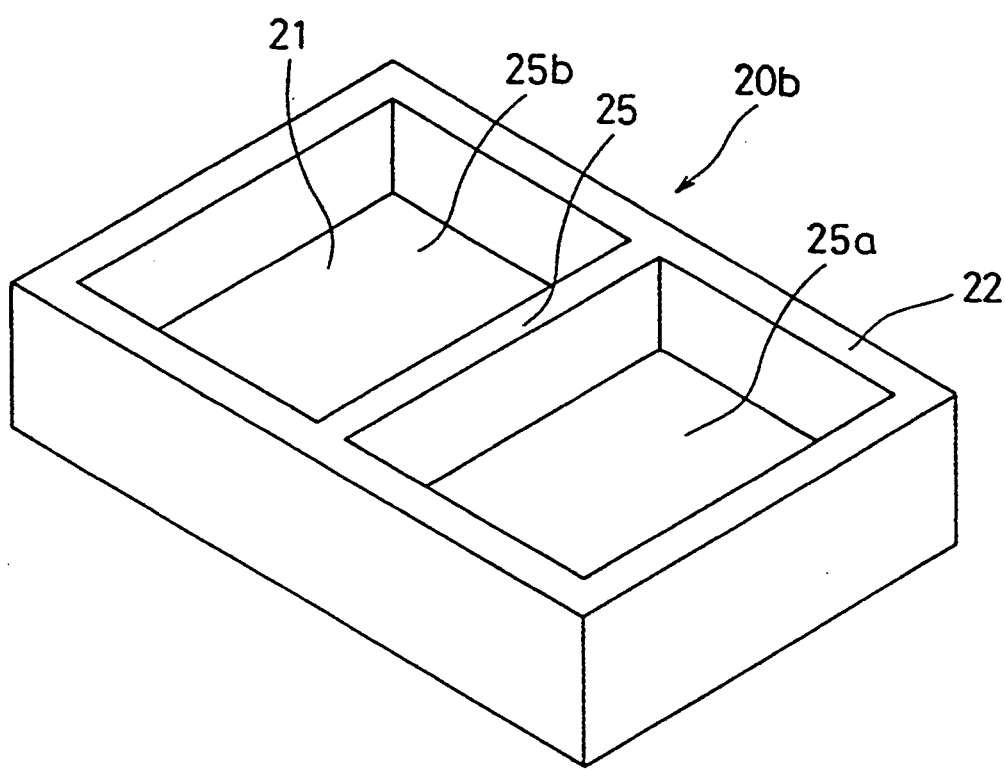
FIG. 10 is a perspective view illustrating a lid for the package body of FIGS. 9(a)–9(c)

FIG. 10 is a perspective view illustrating a lid for the package body of FIGS. 9(a)-9(c). In this third embodiment, the lid 20b comprises a metal or a dielectric material, such as a ceramic, plated with metal. The partition 25 and the cavity wall 22 have no dielectric part.

Figure 11:
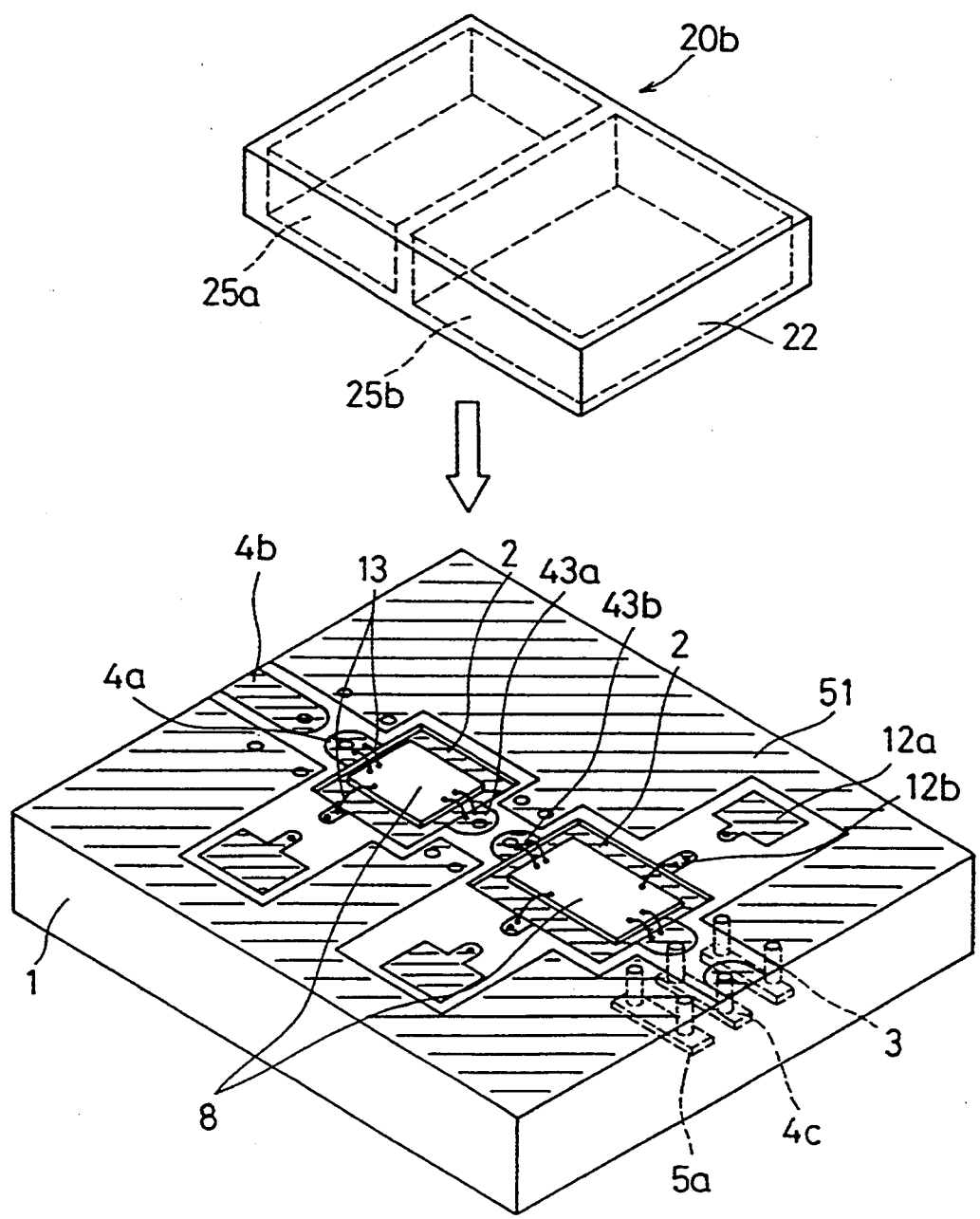
FIG. 11 is a perspective view illustrating the package body of FIGS. 9(a)–9(c) on which IC chips are mounted and the lid of FIG. 10 before the IC chips are covered with the lid.

FIG. 11 is a perspective view illustrating the package body 1 of FIGS. 9(a)-9(c) on which two IC chips 8 are mounted and the lid 20b of FIG. 10, before the IC chips 8 are covered with the lid 20b. On the surface of the package body 1, electrodes (not shown) of each IC chip 8 are connected to the high frequency signal transmission lines 4a and 43a (43b) and the DC bias lines 12b using wires or ribbons 13. Neither the signal transmission line nor the DC bias line are present on a region to be contacted by the lid 20b, but the signal transmission lines 4c and the DC bias lines 12c are buried in the package body opposite the region to be contacted by the lid 20b. In FIG. 11, for simplification, the buried DC bias lines 12c are omitted and the buried signal transmission lines 4c are partially omitted.

When the IC chips 8 are hermetically sealed by the lid 20b, a grounding voltage is applied to the lid 20b from the grounding conductor pattern 51, whereby the IC chips 8 are electromagnetically shielded.

According to the third embodiment of the present invention, in addition to the effects of the first embodiment, the structure of lid 20b is simplified.

Figure 12:
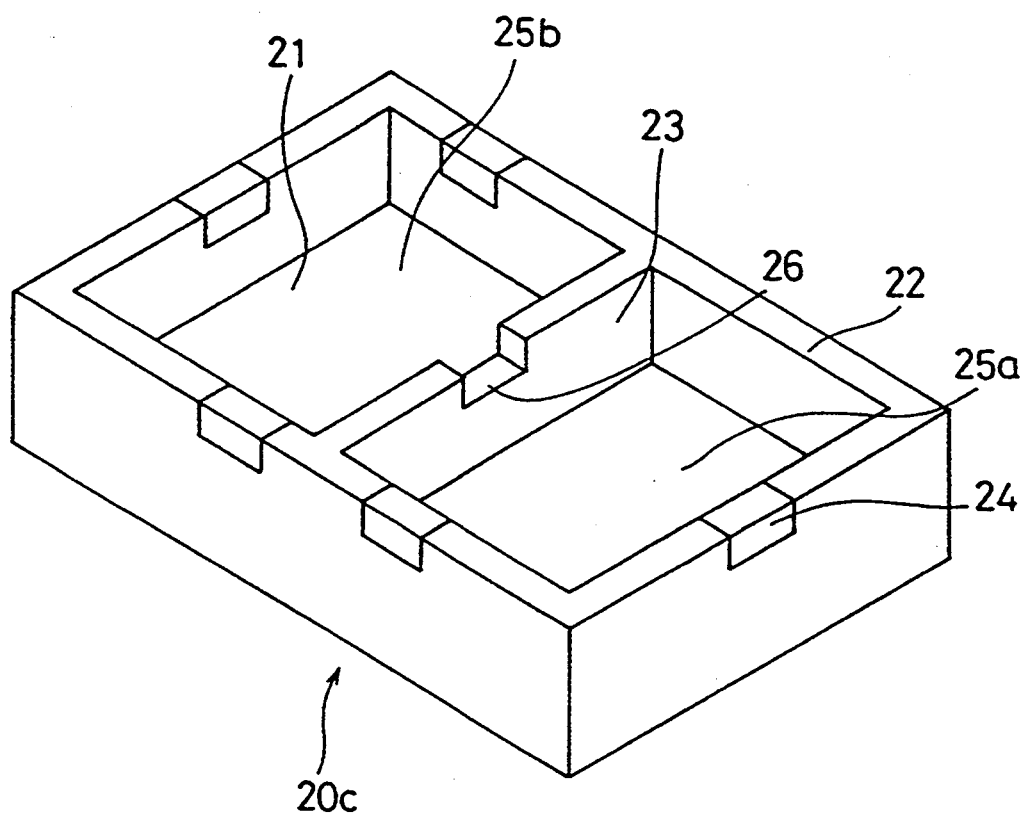
FIG. 12 is a perspective view illustrating a lid of a high frequency IC package in accordance with a fourth embodiment of the present invention.

A description is given of a high frequency IC package in accordance with a fourth embodiment of the present invention. FIG. 12 is a perspective view illustrating a lid 20c according to the fourth embodiment. The structure of the lid 20c is identical to the lid 20 of FIG. 3 except that the partition 23 has a slot 26, in place of the dielectric part 24, at a portion contacting the high frequency signal transmission line 41, whereby short-circuiting between the grounding voltage and the high frequency signal is avoided.

Figure 13:
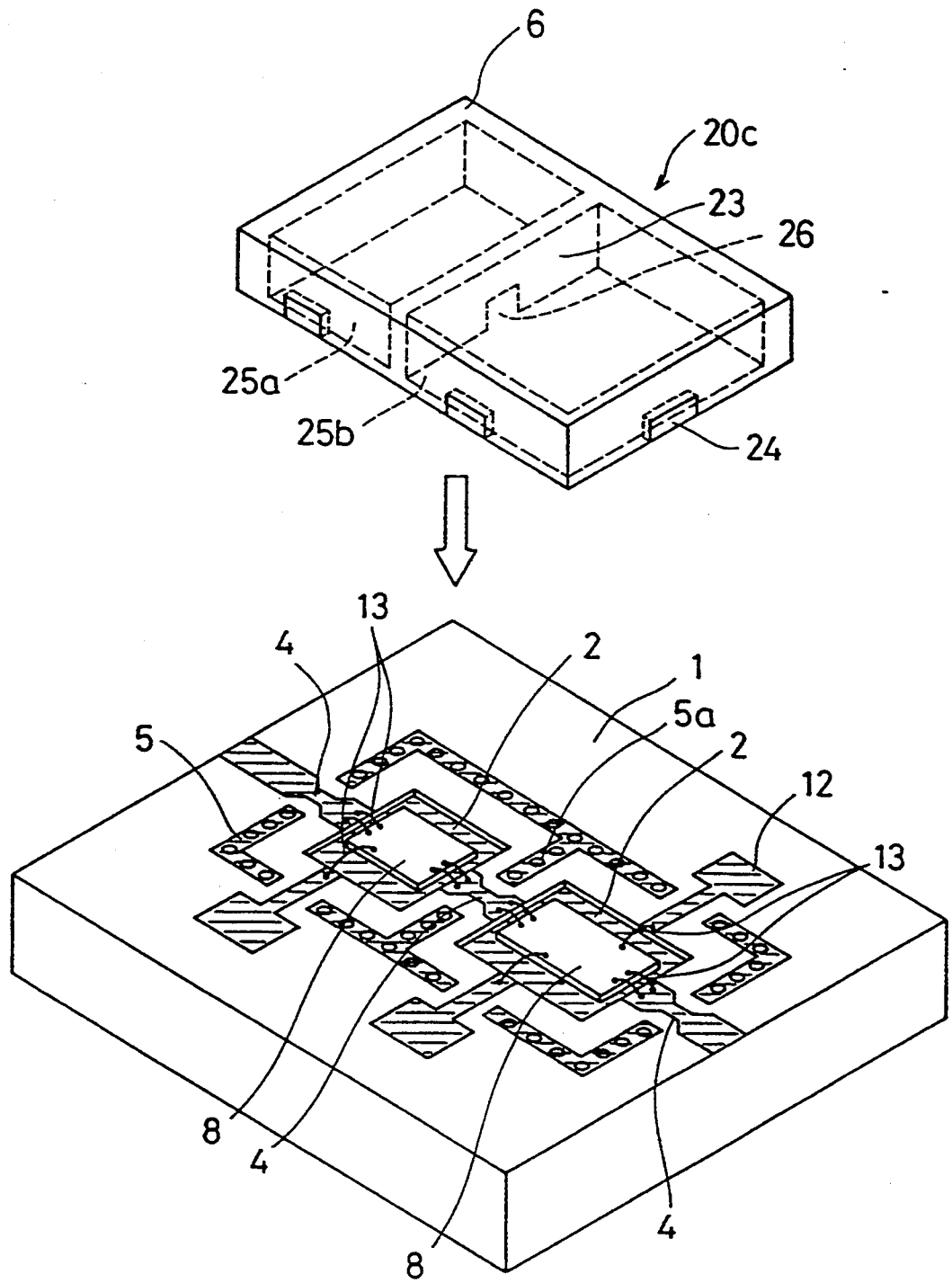
FIG. 13 is a perspective view illustrating a package body on which IC chips are mounted and the lid of FIG. 12 before the IC chips are covered with the lid.

FIG. 13 is a perspective view illustrating a package body on which IC chips are mounted and the lid 20c of FIG. 12, before the IC chips are covered with the lid 20c. The package body is identical to the package body 1 of FIGS. 1(a)-1(b). Also in FIG. 13, electrodes (not shown) of the IC chips 8 are connected to the high frequency signal transmission lines 4 and 41 and the DC bias lines 12 using the wires or ribbons 13.

Figure 14:
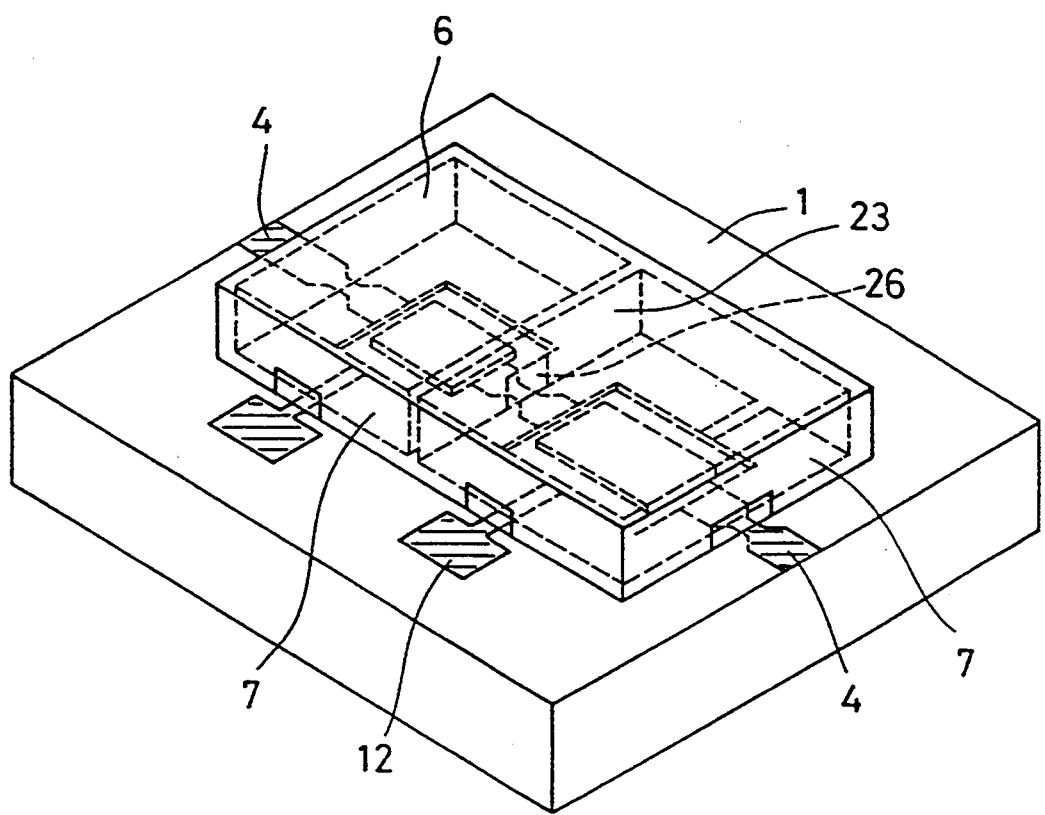
FIG. 14 is a perspective view illustrating a high frequency IC package in accordance with the fourth embodiment of the present invention in which IC chips on the package body are hermetically shielded by the lid of FIG. 12.

FIG. 14 is a perspective view illustrating the high frequency IC package according to the fourth embodiment of the present invention in which the IC chips 8 on the package body 1 are hermetically sealed by the lid 20c. Although the IC chips 8 are covered by the chip housing chambers 25a and 25b of the lid 20c, respectively, since the partition 23 has the slot 26, the chambers 25a and 25b are spatially connected to each other.

Also in this fourth embodiment, the same effects as described in the first embodiment are attained.

Figure 15:
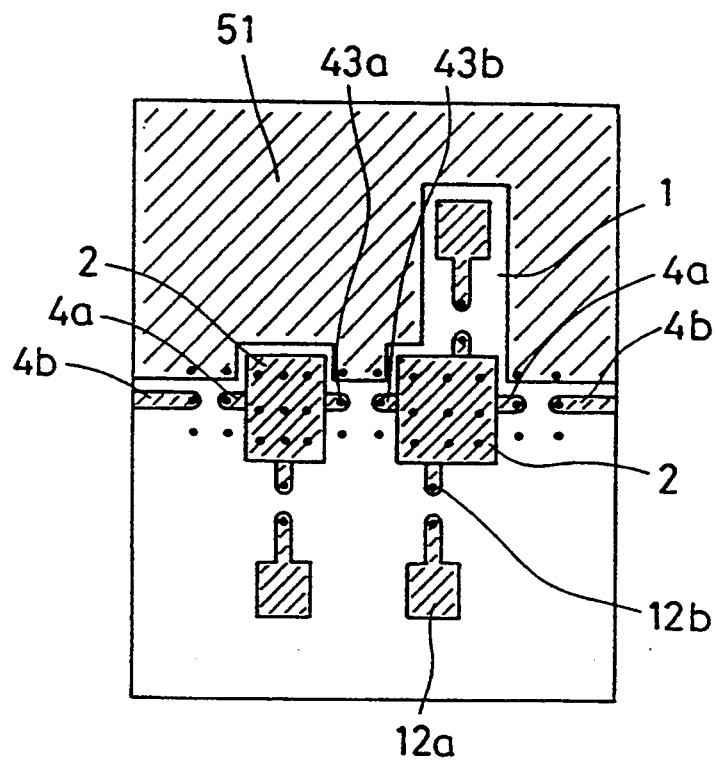
FIGS. 15(a) and 15(b) are a plan view and a sectional view illustrating the package body according to the third embodiment of the present invention on which slot type high frequency signal transmission lines are formed.
Figure 15:
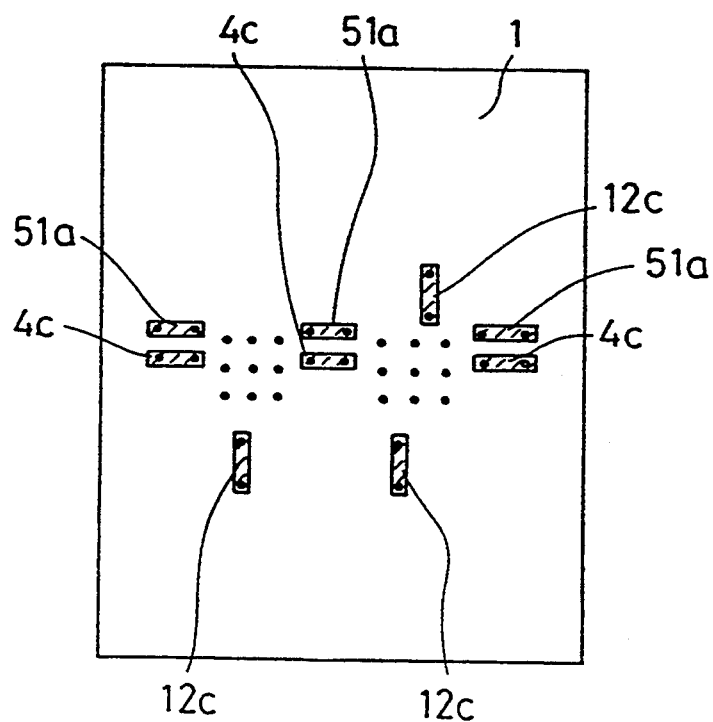
Figure 16:
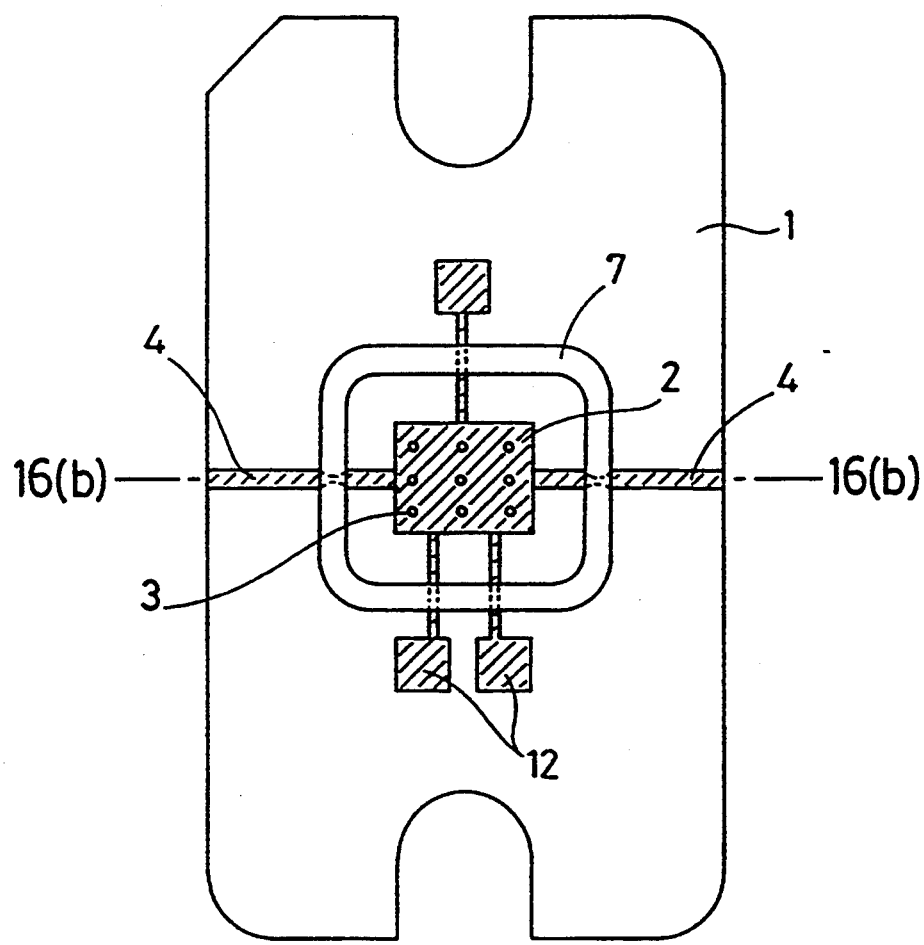
FIGS. 16(a) and 16(b) are a plan view and a sectional view illustrating a package body of a high frequency IC package in accordance with the prior art.
Figure 16:
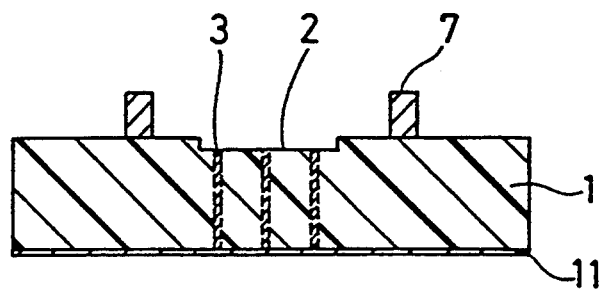
Figure 17:
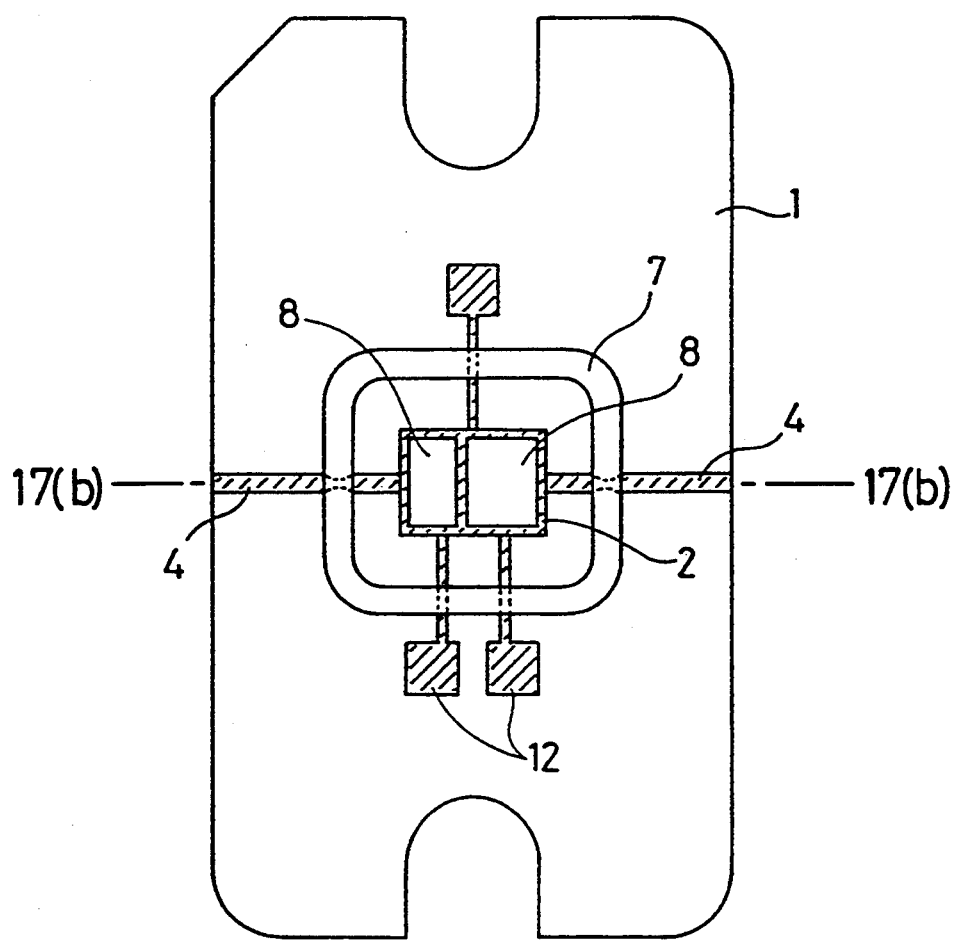
FIGS. 17(a) and 17(b) are a plan view and a sectional view illustrating the package body of FIG. 16(a) and 16(b) on which IC chips are mounted.
Figure 17:
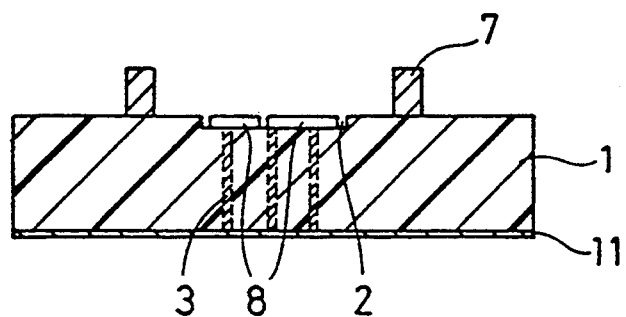
Figure 18:
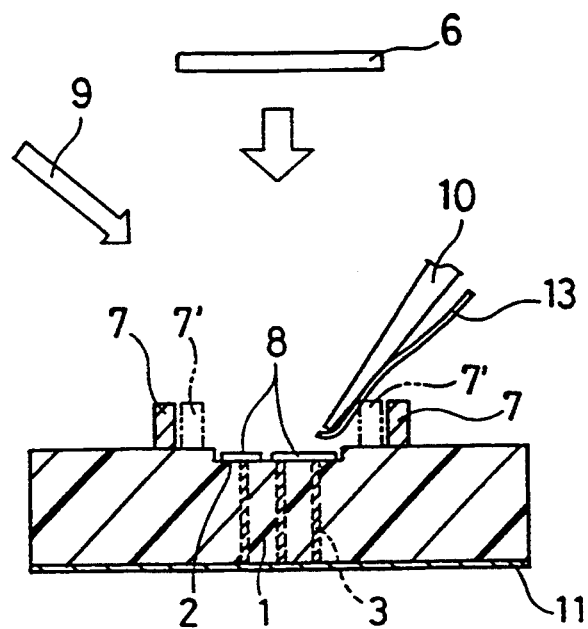
FIG. 18 is a schematic diagram illustrating a wire-bonding process of IC chips on the package body in accordance with the prior art.
Figure 19:
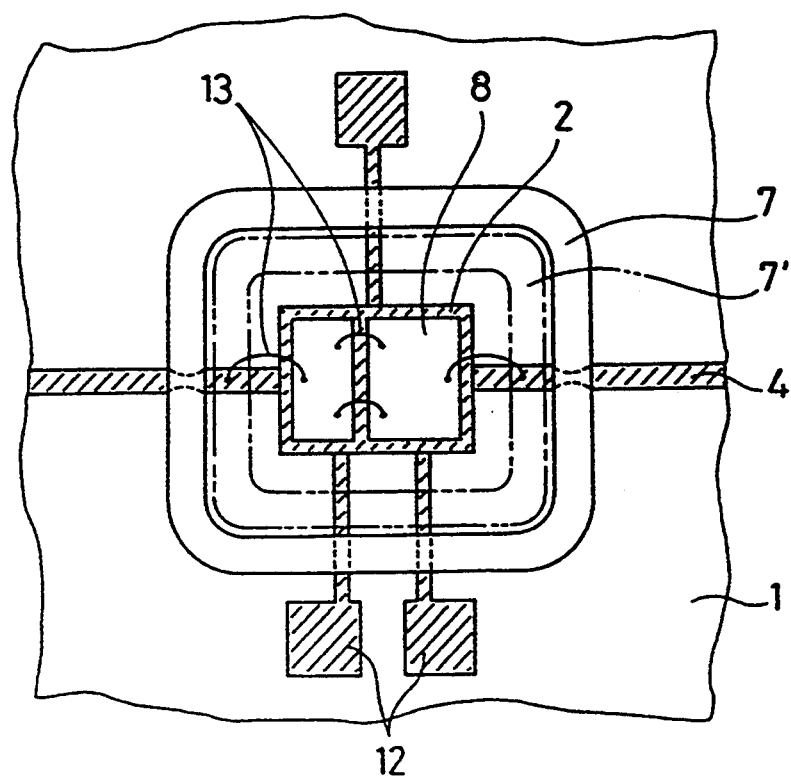
FIG. 19 is a plan view illustrating IC chips and their vicinity for explaining problems of the high frequency IC package in accordance with the prior art.

While in the above-described third embodiment a coplanar type signal transmission line is formed on the surface of the package body, a slot type signal transmission line may be employed. In this case, the grounding conductor 51 is formed on either side of the signal transmission lines 4a, 4b, 43a, and 43b as shown in FIG. 15(a) and the grounding conductors 51a are formed on either side of the buried signal transmission lines 4c as shown in FIG. 15(b).

While in the above-described first to fourth embodiments two IC chips are mounted on the package, the number of IC chips is not restricted thereto.

What is claimed is:

1. A high frequency IC package comprising:
   a dielectric package body having a surface;
   a high frequency signal transmission line, a power supply line, and a ground disposed on the surface of the package body;
   a high frequency IC chip disposed on the surface of the package body and electrically connected to the high frequency signal transmission line and the power supply line by wires; and
   an electrically conductive lid hermetically sealing and shielding the IC chip, the lid comprising a plane part parallel to the surface of the package body and side walls perpendicular to the plane part and surrounding the IC chip, the side walls including insulating parts in contact with the high frequency signal transmission line and the power supply line and electrically conducting parts in contact with the ground pattern.

2. The high frequency IC package of claim 1 wherein a plurality of high frequency IC chips are disposed on the surface of the package body, and the lid includes at least one partition dividing space inside the lid into at least two spaces housing respective IC chips.

3. The high frequency IC package of claim 2 wherein each of the partitions comprises two spaced apart sub-partitions disposed between adjacent IC chips.

4. The high frequency IC package of claim 3 wherein a second signal transmission line connecting adjacent IC chips is disposed on the surface of the package body, and the sub-partitions include one of electrically insulating parts and slots opposite the second transmission line.

5. The high frequency IC package of claim 3 wherein adjacent IC chips are connected to each other by a third signal transmission line disposed between the sub-partitions between the adjacent IC chips.

* * * * *